United States Patent
Itkin (10) Patent No.: US 11,221,398 B2
(45) Date of Patent: Jan. 11, 2022

(54) SAFETY COMPLIANT RECEIVER MONITORING

(71) Applicant: Infineon Technologies AG, Neubiberg (DE)

(72) Inventor: Grigory Itkin, Munich (DE)

(73) Assignee: Infineon Technologies AG, Neubiberg (DE)

( * ) Notice: Subject to any disclaimer, the term of this patent is extended or adjusted under 35 U.S.C. 154(b) by 274 days.

(21) Appl. No.: 16/545,879

(22) Filed: Aug. 20, 2019

(65) Prior Publication Data

US 2021/0055379 A1 Feb. 25, 2021

(51) Int. Cl.
*G01S 7/40* (2006.01)
*H03H 11/28* (2006.01)
*H01Q 23/00* (2006.01)

(52) U.S. Cl.
CPC ............. *G01S 7/4021* (2013.01); *G01S 7/40* (2013.01); *H01Q 23/00* (2013.01); *H03H 11/28* (2013.01)

(58) Field of Classification Search
CPC .......... G01S 7/032; G01S 7/40; G01S 7/4021; G01S 7/4052; G01S 7/4069; H01Q 23/00; H03H 11/28; H03H 7/38; H03H 7/40; Y02E 30/30
See application file for complete search history.

(56) References Cited

U.S. PATENT DOCUMENTS

| | | | | |
|---|---|---|---|---|
| 2006/0250158 A1* | 11/2006 | Yaguchi | ............. | H03K 19/0005 326/86 |
| 2013/0094556 A1* | 4/2013 | Itkin | .................... | H04B 1/3833 375/224 |
| 2019/0068156 A1* | 2/2019 | Hueber | .................. | G01R 27/02 |
| 2019/0068298 A1* | 2/2019 | Sharma | .................. | H04B 17/19 |

* cited by examiner

*Primary Examiner* — Timothy X Pham
(74) *Attorney, Agent, or Firm* — Harrity & Harrity, LLP (57) ABSTRACT

A device may include a test signal generator and a receive antenna input. The device may include a switchable impedance matching circuit, coupled to the test signal generator and to a receive chain, to cause an impedance matching between the test signal generator and a component of the receive chain to be increased during a monitoring phase. The impedance matching during the monitoring phase enables one or more measurements based on a test signal generated by the test signal generator. The switchable impedance matching circuit may cause a partial impedance mismatching between the test signal generator and the component of the receive chain during a verification phase associated with verifying a return of the switchable impedance matching circuit to an impedance matching caused during the operational phase. The device may include a control circuit to verify operation of the returning of the switchable impedance matching circuit in the verification phase.

14 Claims, 8 Drawing Sheets

SAFETY COMPLIANT RECEIVER MONITORING

BACKGROUND

A radio frequency (RF) device, such as a radar monolithic microwave integrated circuit (MMIC), may need to verify that one or more components of a receive (RX) chain of the RF device are operating according to an applicable specification. In some cases, the RF device may use an RX monitoring procedure in order to perform this verification. A result of the RX monitoring procedure can, however, be impacted by the presence of external distortions received via an antenna of the RF device during performance of the RX monitoring.

SUMMARY

According to some implementations, a device may include a receive antenna input to couple a receive chain of the device to a receive antenna; a test signal generator; and a switchable impedance matching circuit coupled to the test signal generator and to the receive chain to: cause an impedance matching between the test signal generator and at least one component of the receive chain to be increased during a monitoring phase, wherein the impedance matching between the test signal generator and the at least one component of the receive chain is to be increased relative to an impedance matching between the test signal generator and the at least one component of the receive chain during an operational phase, wherein the monitoring phase is associated with monitoring the at least one component of the receive chain of the device, and wherein the impedance matching during the monitoring phase enables one or more measurements based on a test signal generated by the test signal generator; and cause a partial impedance mismatching between the test signal generator and the at least one component of the receive chain during a verification phase, wherein the verification phase is associated with verifying a return of the switchable impedance matching circuit to an impedance matching caused during the operational phase; and a control circuit to verify operation of the returning of the switchable impedance matching circuit in the verification phase.

According to some implementations, a method may include providing, by a switchable impedance matching circuit, an impedance matching between a test signal generator and at least one component of a receive chain of a device during a monitoring phase relative to an impedance matching between the test signal generator and the at least one component of the receive chain during an operational phase, wherein the monitoring phase is associated with monitoring one or more components of the receive chain of the device, and wherein the impedance matching during the monitoring phase enables one or more measurements based on a test signal generated by the test signal generator; and providing, by the switchable impedance matching circuit, partial impedance mismatching between the test signal generator and the at least one component of the receive chain during a verification phase, wherein the verification phase is associated with verifying a return of the switchable impedance matching circuit to an impedance matching caused during the operational phase.

According to some implementations, a device may include a mismatching switch to: cause, in a first switching state: an impedance mismatching between a receive antenna input and an input of a receive chain, and an impedance matching between a test signal generator and a test signal input of the receive chain, wherein the impedance mismatching between the receive antenna input and the input of the receive chain substantially isolates the input of the receive chain from the receive antenna input; and cause, in a second switching state: an impedance matching between the receive antenna input and the input of the receive chain, and a partial impedance mismatching between the test signal generator and the test signal input of the receive chain.

According to some implementations, a method may include determining a first output signal level during a monitoring phase associated with monitoring one or more components of a receive chain of a device, wherein impedance matching between a test signal generator and the one or more components of the receive chain is provided by a switchable impedance matching circuit during the monitoring phase; determining a second output signal level during a verification phase, wherein partial impedance mismatching between the test signal generator and the one or more components is provided by the switchable impedance matching circuit during the verification phase; and verifying operation of the switchable impedance matching circuit based on the first output signal level and the second output signal level.

DETAILED DESCRIPTION

The following detailed description of example implementations refers to the accompanying drawings. The same reference numbers in different drawings may identify the same or similar elements.

As described above, an RF device (e.g., a radar MMIC) may use an RX monitoring procedure to verify that components of an RX chain of the RF device are operating in accordance with an applicable specification. However, as noted above, external distortions received via an antenna of the RF device may corrupt a result of the RX monitoring procedure. That is, external distortions received via the antenna of the RF device may affect measurements performed during the RX monitoring procedure and, therefore, impact reliability of the RX monitoring procedure.

One technique for resolving the issue of these external distortions is to disconnect the antenna from the other components of the RX chain when performing the RX monitoring, to eliminate the effect of any external distortions on the RX monitoring. This technique may be implemented using, for example, a switch (e.g., arranged before or after an RX impedance matching component on an RF signal path) that isolates the RX chain from the source of the external distortions (i.e., the antenna). The antenna can then be reconnected to the RX chain after the RX monitoring procedure is complete. However, while this technique may provide improved isolation from external distortions received via the antenna, this technique may not meet a safety standard since monitoring whether the antenna is correctly reconnected to the RX chain after the RX monitoring is finished is not possible. For example, when this technique is implemented using a switch, as described above, it is not possible to verify that the switch returns to a position in which the antenna is connected to the RX chain after the RX monitoring is finished.

Some implementations described herein provide an improved RF device that achieves safety compliant RX monitoring. In some implementations, the safety compliant RX monitoring is provided based on including a single additional component in the RF device, namely a switchable impedance matching circuit.

In some implementations, the switchable impedance matching circuit causes impedance matching between a test signal generator and (one or more components of) the RX chain to be increased during a monitoring phase associated with monitoring the RX chain of the device. The increased impedance matching between the test signal generator and the RX chain enables measurements based on a test signal generated by the test signal generator. Conversely, the switchable impedance matching circuit may cause impedance mismatching between an antenna input and the RX chain during the monitoring phase. The impedance mismatching between the antenna input and the RX chain during the monitoring phase provides isolation of the RX chain from the antenna, thereby preventing external distortions from impacting RX monitoring.

Additionally, the switchable impedance matching circuit may cause a partial impedance mismatching between the test signal generator and the RX chain during a verification phase. The verification phase may be associated with verifying a return of the switchable impedance matching circuit to causing an impedance matching between the antenna input and the RX chain. That is, the verification phase may be associated with verifying that the antenna has been reconnected to the RX chain such that the RF device can resume normal operation. Additional example implementation details are described below.

The switchable impedance matching circuit described herein allows all components of the RX chain to be monitored during the monitoring phase, while enabling detection of whether the antenna has been reconnected to the RX chain after RX monitoring is finished. As a result, safety compliant RX monitoring is achieved. Further, the switchable impedance matching circuit may be implemented as single component and, therefore, can provide safety compliant RX monitoring without a significant impact on chip space or cost.

Figure 1A:
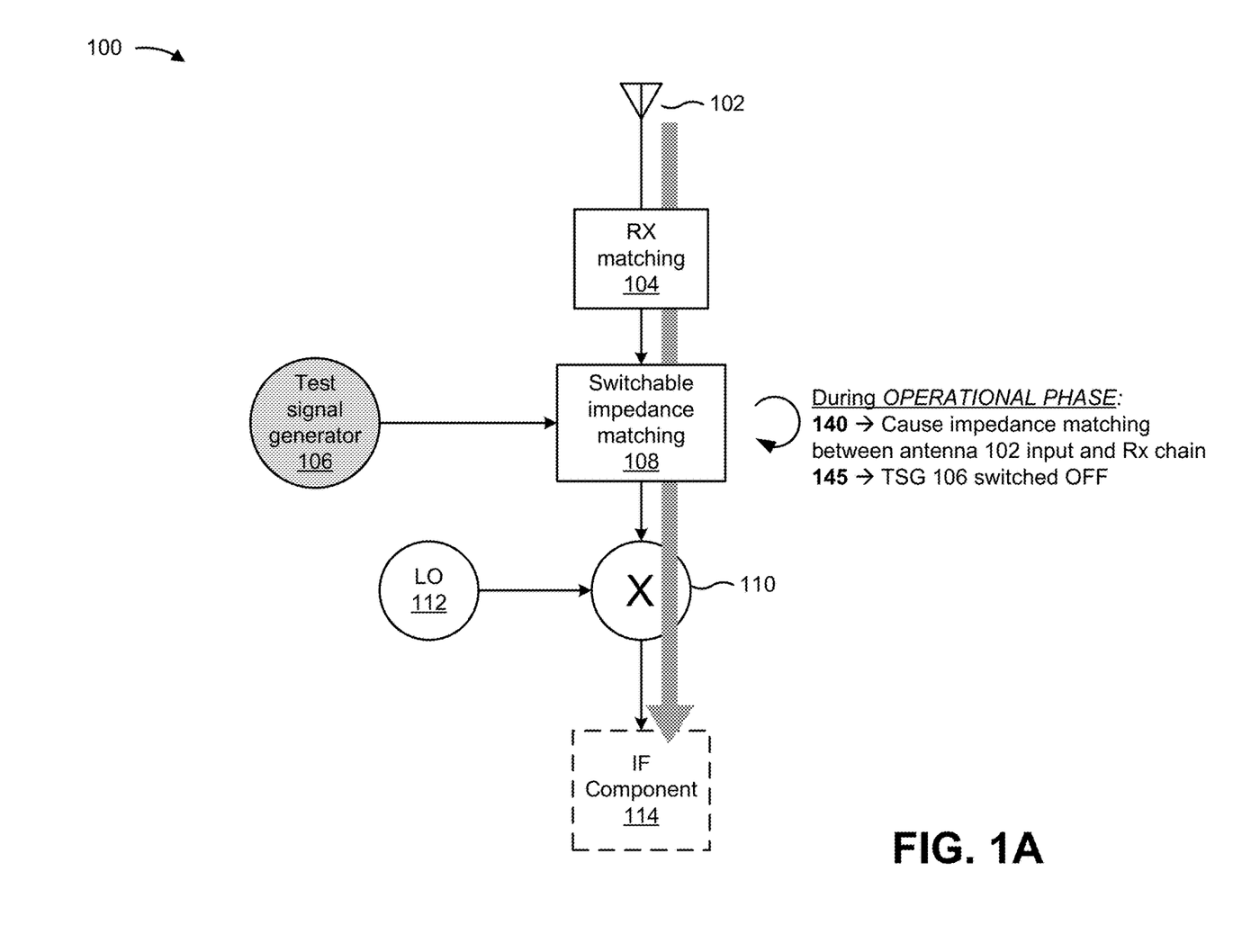
FIGS. 1A-1C are diagrams of an example implementation described herein.
Figure 1B:
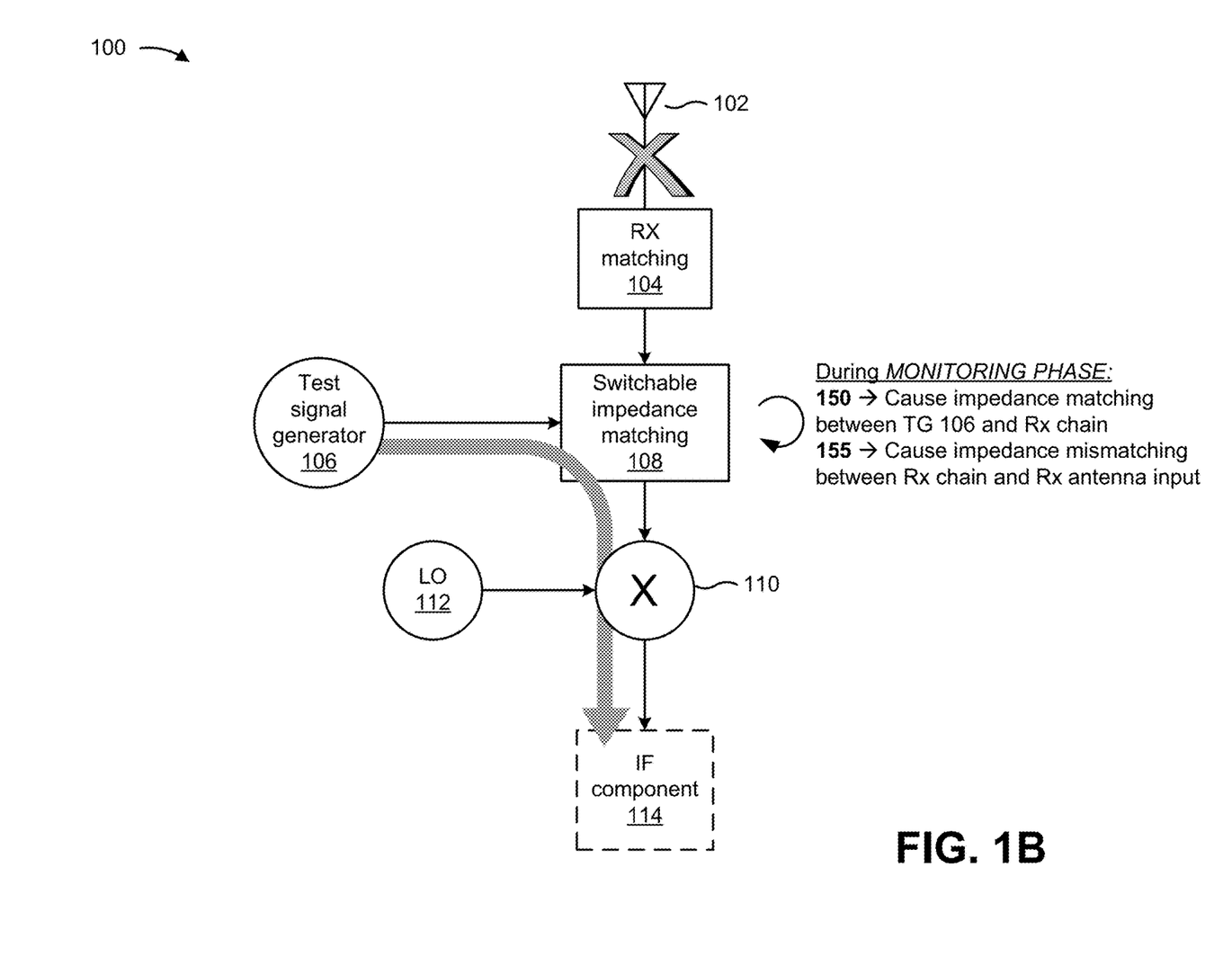
Figure 1C:
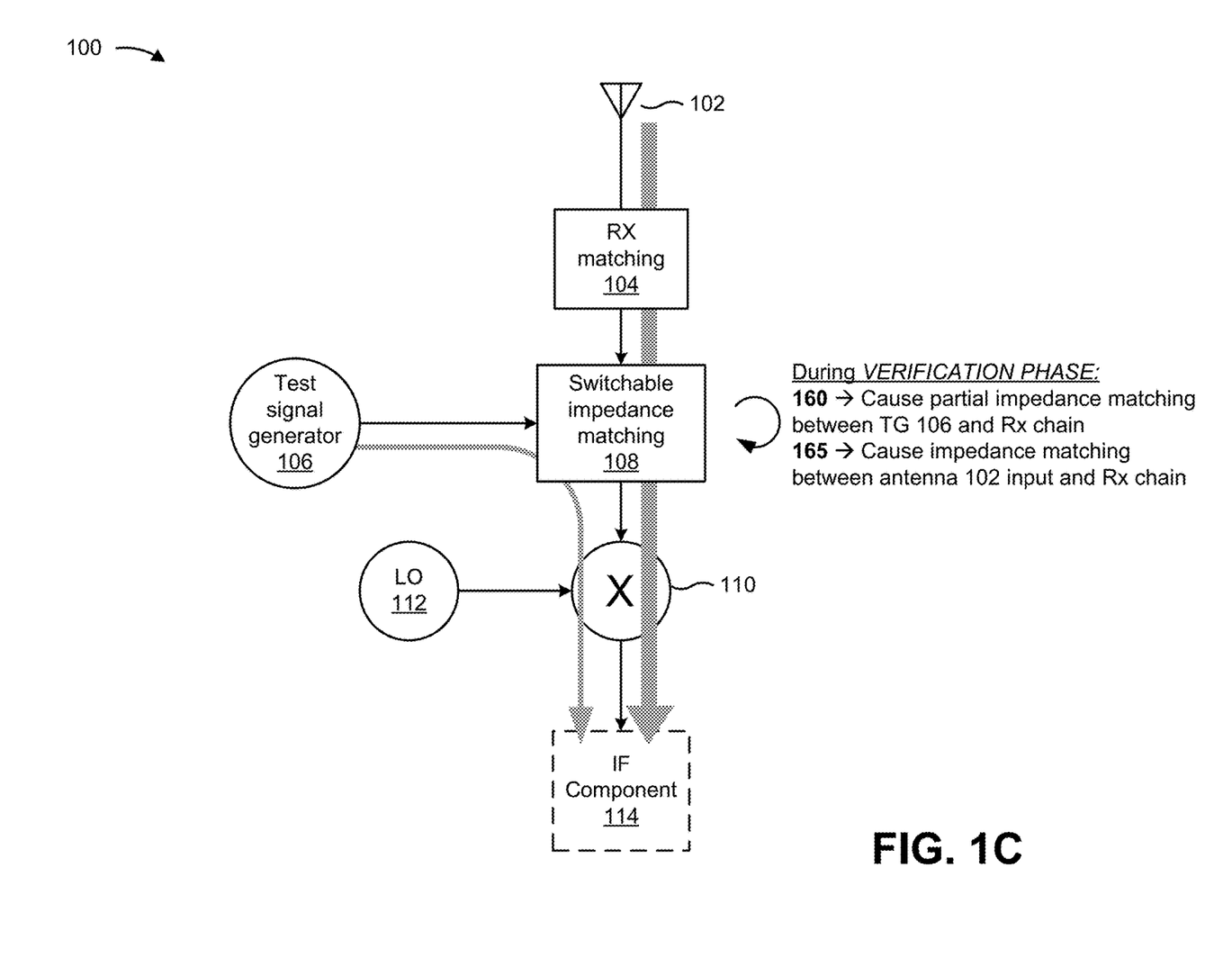

FIGS. 1A-1C are diagrams of an example implementation associated with an RF device (herein referred to as device 100) described herein. As shown in FIG. 1A, in some implementations, device 100 may include an antenna 102, an RX matching component 104, a test signal generator 106, a switchable impedance matching circuit 108, a mixer 110, a local oscillator (LO) 112, and an intermediate frequency (IF) component 114. In some implementations, the RX chain of device 100 may include RX matching component 104, mixer 110, LO 112, IF component 114, and/or one or more other types of RX chain components not illustrated in FIG. 1. The components of device 100 are described as follows, followed by a description of an example operation of device 100 in association with performing safety compliant RX monitoring.

Antenna 102 includes an antenna to receive radio waves and produce an electrical signal (i.e., an RF signal). Antenna 102 may be coupled to input (herein referred to as an input of antenna 102) that enables the RF signal to be provided to the RX chain of device 100 for further signal processing.

RX matching component 104 includes a component to provide antenna matching associated with antenna 102 of device 100. For example, when antenna 102 has a lower impedance (e.g., 50 Ohms) and mixer 110 has a high impedance (e.g., 100 Ohms), RX matching component 104 may provide impedance matching from the low impedance to the relatively high impedance. In some implementations, RX matching component 104 may be a component in the RX chain of device 100.

Test signal generator 106 includes a component capable of generating a test signal based on which RX monitoring can be performed, as described herein. In some implementations, test signal generator 106 may be selectively switched on (to provide the test signal) or off (such that test signal generator 106 does not provide the test signal), as described herein. In some implementations, the test signal generated by test signal generator 106 may be an RF signal.

Switchable impedance matching circuit 108 (also referred to herein as a mismatching switch) includes a component capable of providing safety compliant RX monitoring. For example, switchable impedance matching circuit 108 may cause an impedance matching between test signal generator 106 and the RX chain (e.g., at least one component of the RX chain) to be increased during a monitoring phase, may cause a partial impedance mismatching between test signal generator 106 and the RX chain (e.g., the at least one component of the RX chain) during a verification phase, may cause an impedance mismatching between the input of antenna 102 and an input of the RX chain during the monitoring phase, and/or may cause an impedance matching between the input of antenna 102 and the input of the RX chain during the operational phase. In some implementations, switchable impedance matching circuit 108 may include a single component, such as a diode, a metal-oxide-semiconductor (MOS) transistor, an n-type MOS (NMOS) transistor, a p-type MOS (PMOS) transistor, or another type of switchable element.

Mixer 110 includes a component to mix an RF signal with an LO signal in association with performing frequency conversion of the RF signal to another frequency, such as an intermediate frequency (IF) (e.g., by multiplying the RF signal and the LO signal). In some implementations, mixer 110 may convert the RF signal to an IF signal to enable further signal processing by IF component 114.

LO 112 includes an oscillator that provides the LO signal for mixing by mixer 110. In some implementations, LO 112 may be coupled to mixer 110 such that mixer 110 can use the LO signal to convert the frequency of the RF signal to the IF signal, as described above.

IF component 114 includes one or more components associated with processing an IF signal generated by mixer 110. For example, IF component 114 may include an analog front end (AFE), one or more analog-to-digital converters (ADCs), a digital front end (DFE), and/or the like. In some implementations, the AFE may filter and/or process the IF signal to create an amplified and filtered IF signal for conversion by the one or more ADCs. The one or more ADCs may convert the amplified/filtered IF signal from the analog domain to the digital domain. The DFE may process a digital signal provided by the one or more ADCs, and output a processed digital signal.

In some implementations, device 100 may further include or be coupled to a control circuit associated with verifying operation of switchable impedance matching circuit 108 during the verification phase and/or one or more other operations. The control circuit may, for example, verify the operation of switchable impedance matching circuit 108 based on detecting, during the verification phase, a characteristic of the test signal generated by test signal generator 106. In some implementations, the control circuit may be included in IF component 114. As another example, the control circuit may verify that test generator 106 has been switched off or is undamaged based on, for example a characteristic of the test signal.

An example operation of device 100 is illustrated in FIGS. 1A-1C. As shown in FIG. 1A by reference number 140, during an operational phase (i.e., when device 100 is operating normally), switchable impedance matching circuit 108 may cause an impedance matching between an input of antenna 102 and an input of the RX chain of device 100. As indicated by the gray arrow in FIG. 1A, the impedance matching between the input of antenna 102 and the input of the RX chain allows the signal at antenna 102 to be processed by the components of the RX chain (e.g., RX matching component 104, mixer 110, and IF component 114). In some implementations, an impedance matching may be a matching that provides than a return loss less than −10 decibels (dB). As shown by reference number 145, during the operational phase, test signal generator 106 may be powered off (e.g., such that test signal generator 106 does not provide a test signal). In some implementations, switchable impedance matching circuit 108 may cause an impedance matching between test signal generator 106 and the RX chain.

In some implementations, device 100 may switch from a normal operation mode to a monitoring mode (e.g., when the operational phase is finished). In other words, the monitoring phase may follow the operational phase. The monitoring phase is a phase during which device 100 performs monitoring, testing, checking, or the like, of one or more components of the RX chain. In some implementations, switchable impedance matching circuit 108 may include a switch coupled to a control signal generator that provides a signal in association with controlling switchable impedance matching circuit 108. Here, the switch may be used to cause control signal generator to provide a signal that causes switchable impedance matching circuit 108 to enable normal operation (e.g., during the operational phase), RX monitoring (e.g., during the monitoring phase), or verification (e.g., during a verification phase), as described herein. In some implementations, test signal generator 106 may be switched on prior to or at a start of the monitoring phase. A switching state of switchable impedance matching circuit 108 during the monitoring phase may be referred to herein as a first switching state.

As shown in FIG. 1B by reference number 150, during the monitoring phase (i.e., when device 100 is performing measurements associated with RX monitoring), switchable impedance matching circuit 108 may cause an impedance matching between test signal generator 106 and the RX chain (e.g., one or more components of the RX chain) to be increased. Here, the impedance matching between test signal generator 106 and the RX chain is increased relative to the impedance matching between test signal generator 106 and the RX chain during the operational phase (i.e., such that the impedance matching between test signal generator 106 and the RX chain during the monitoring phase is better than the impedance matching between the test signal generator 106 and the RX chain during the operational phase). In some implementations, the impedance matching between test signal generator 106 and the RX chain during the monitoring phase may have a slight impedance mismatch (while still being comparatively improved). As indicated by the gray arrow in FIG. 1B, the impedance matching between test signal generator 106 and the RX chain during the monitoring phase enables one or more measurements based on the test signal generated by test signal generator 106. As shown by reference number 155, during the monitoring phase, switchable impedance matching circuit 108 may further cause an impedance mismatching between the input of antenna 102 and the input of the RX chain. As indicated by the gray "X" at the top of FIG. 1B, the impedance mismatching between the input of antenna 102 and the input of the RX chain may provide substantial isolation (e.g., 10 dB or better isolation) of antenna 102 from the RX chain, thereby preventing external distortions from impacting measurements performed based on the test signal during the monitoring phase.

In some implementations, device 100 may switch from the monitoring mode to a verification mode (e.g., when the monitoring phase is finished). In other words, the verification phase may follow the monitoring phase. The verification phase is a phase during which device 100 verifies a return of switchable impedance matching circuit 108 to providing an impedance matching caused during the operational phase (i.e., a verification that switchable impedance matching circuit 108 has returned to a configuration that provides normal operation of device 100). In some implementations, the switch coupled to the control circuit generator may cause a signal, associated with causing device 100 to operate in the verification phase, to be provided to switchable impedance matching circuit 108. A switching state of switchable impedance matching circuit 108 during the verification phase may be referred to herein as a second switching state.

As shown in FIG. 1C by reference number 160, during the verification phase, switchable impedance matching circuit 108 may cause a partial impedance mismatching between test signal generator 106 and the RX chain (e.g., at least one component of the RX chain). As indicated by the comparatively thin gray arrow in FIG. 1C, the partial impedance matching between test signal generator 106 and the RX chain provides limited isolation of test signal generator 106 from the RX chain. As shown by reference number 165, during the verification phase, switchable impedance matching circuit 108 may cause the impedance matching between the input of antenna 102 and the input of the RX chain (i.e., the impedance matching between the input of antenna 102 and the input of the RX chain as described above in association with FIG. 1A). As indicated by the comparatively thick gray arrow in FIG. 1C, the impedance matching between the input of antenna 102 and the input of the RX chain prevents isolation of antenna 102 from the RX chain. In other words, during the verification phase, switchable impedance matching circuit 108 may discontinue isolation of the input of antenna 102 from the input of the RX chain, while also providing limited isolation of test signal generator 106 from the RX chain.

In some aspects, a control circuit included in or connected to device 100 (e.g., included in IF component 114) may verify operation of the returning of switchable impedance matching circuit 108 in the verification phase. For example, the control circuit may verify the operation of the returning of switchable impedance matching circuit 108 based on detecting, during the verification phase, at least one characteristic (e.g., an output signal level) of the test signal from test signal generator 106. In some implementations, in association with performing this verification, the control circuit may determine a first output signal level associated with monitoring the RX chain (e.g., one or more components of the RX chain) during the monitoring phase. The first output signal level may be a level of the test signal during the monitoring phase. The control circuit may then determine a second output signal level during the verification phase. The second output signal level may be a level of the test signal during the verification phase. Here, the control circuit may verify the returning of switchable impedance matching circuit 108 based on the first output signal level and the second output signal level (e.g., based on determining that the second signal level is lower than the first signal level by a particular amount). For example, in case of a successful switch back of switchable impedance matching circuit 108 (e.g., to a position needed for normal operation) the first output signal level (e.g., between approximately 6 dB and 8 dB) may differ from the second output signal level by a known, predictable, or expected amount. This difference in output signal level may be used to verify that the circuitry of device 100 has returned to normal operation conditions. Put another way, the partial impedance mismatch enables determination of whether the test signal is at a predictable level (e.g., 5 dB, 6 dB). Further, in some implementations, the control circuit may detect whether test signal generator 106 is switched off and/or is damaged based at least in part on an output signal level. If the test signal were completely mismatched (rather than being partially mismatched), distinguishing the test signal would not be possible and, therefore, verification that switchable impedance matching circuit 108 has returned to an operational position, or detection that test signal generator 106 is switched off or is damaged, would not be possible.

In some implementations, when the verification phase is finished, device 100 may switch from the verification mode to the normal operation mode (i.e., another operational phase may begin). In some implementations, after the verification phase, test signal generator 106 may be powered off (e.g., based on a control signal, after a predetermined amount of time, and/or the like).

As indicated above, FIGS. 1A-1C are provided merely as one or more examples. Other examples may differ from what is described with regard to FIGS. 1A-1C. Further, the number and arrangement of components shown in FIGS. 1A-1C are provided as one or more examples. In practice, there may be additional components, fewer components, different components, or differently arranged components than those shown in FIGS. 1A-1C. Furthermore, two or more components shown in FIGS. 1A-1C may be implemented within a single component, or a single component shown in FIGS. 1A-1C may be implemented as multiple, distributed components. Additionally, or alternatively, a set of components (e.g., one or more components) of device 100 may perform one or more functions described as being performed by another set of components of device 100.

Figure 2:
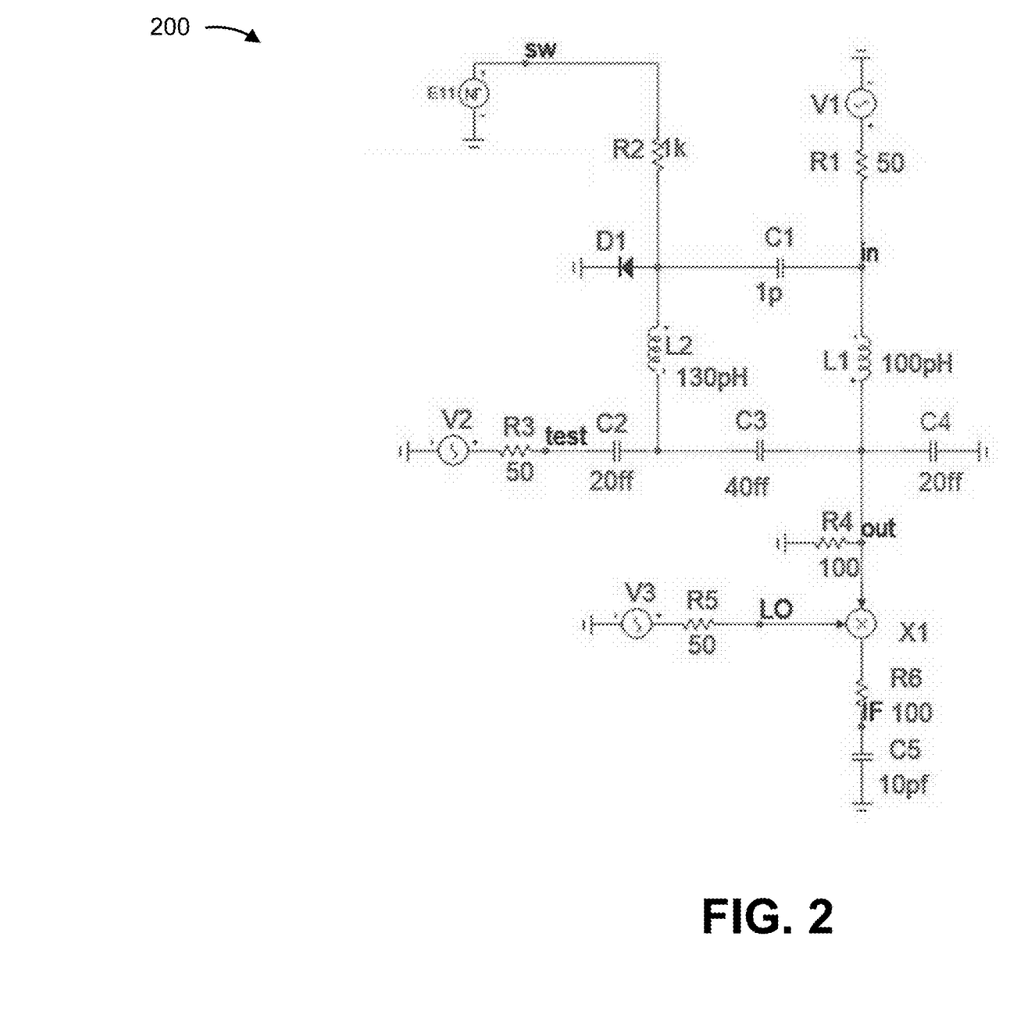
FIG. 2 is a diagram of an example implementation of the switchable impedance matching circuit shown in FIGS. 1A-1C.

FIG. 2 is a diagram of an example implementation 200 of switchable impedance matching circuit 108 shown in FIGS. 1A-1C. In example implementation 200, component V1 represents antenna 102. The RF signal received at component V1 passes through RX matching component 104, which is represented collectively by component L1 and capacitor C4, to mixer 110, which is represented by component X1. In this example, mixer 110 has an impedance of 100 Ohms and, therefore, components L1 and C4 provide impedance matching from 50 Ohms to 100 Ohms.

Test signal generator 106 is represented by component V2 and may further include capacitor C3. In example implementation 200, a test signal generated by component V2 is also matched from 50 Ohms to 100 Ohms. The test signal can be used for RX monitoring purposes, as described herein. LO 112 is represented by component V3. Antenna 102, test signal generator 106, and LO 112 are shown as having source impedances of 50 Ohms (shown as resistors R1, R3, and R5). These are for simulation purposes and may not be parts of an actual schematic.

In example implementation 200, switchable impedance matching circuit 108 is represented by diode D1 and matching components C1, C2, and L2. Diode D1 may be switched on and off by a control signal provided by component E11 (e.g., a control signal generator). Thus, the control signal may be used to cause device 100 to operate in the monitoring phase, the verification phase, or the operational phase, as described herein. When activated by the control signal, diode D1 provides impedance mismatching between the input of component V1 (i.e., antenna 102) through component C1 while, at the same time, providing impedance matching of the test signal through component L2. Thus, in some implementations, the components C1, C2, and L2 can provide an impedance mismatching between an input of antenna 102 and the RX chain during the monitoring phase, partial impedance mismatching between test signal generator 106 and the RX chain during the verification phase, and impedance matching between test signal generator 106 and the RX chain during the monitoring phase, as described herein.

The number and arrangement of components shown in FIG. 2 are provided as an example. In practice, switchable impedance matching circuit 108 may include additional components, fewer components, different components, or differently arranged components than those shown in FIG. 2. Additionally, or alternatively, a set of components (e.g., one or more components) of switchable impedance matching circuit 108 may perform one or more functions described as being performed by another set of components of switchable impedance matching circuit 108.

Figure 3A:
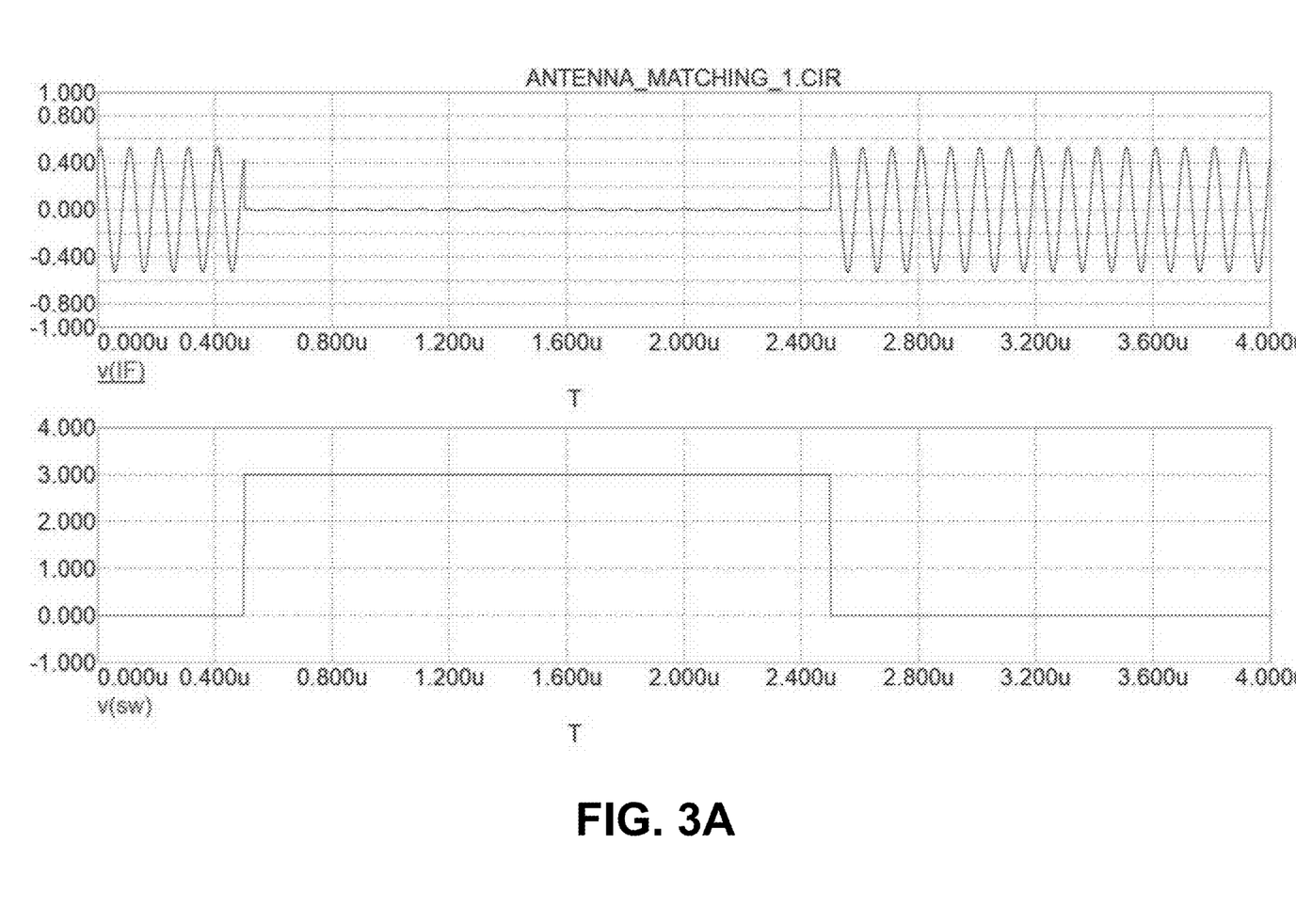
FIGS. 3A and 3B are diagrams of illustrative examples of output signal levels used for verifying operation of a switchable impedance matching circuit described herein.
Figure 3B:
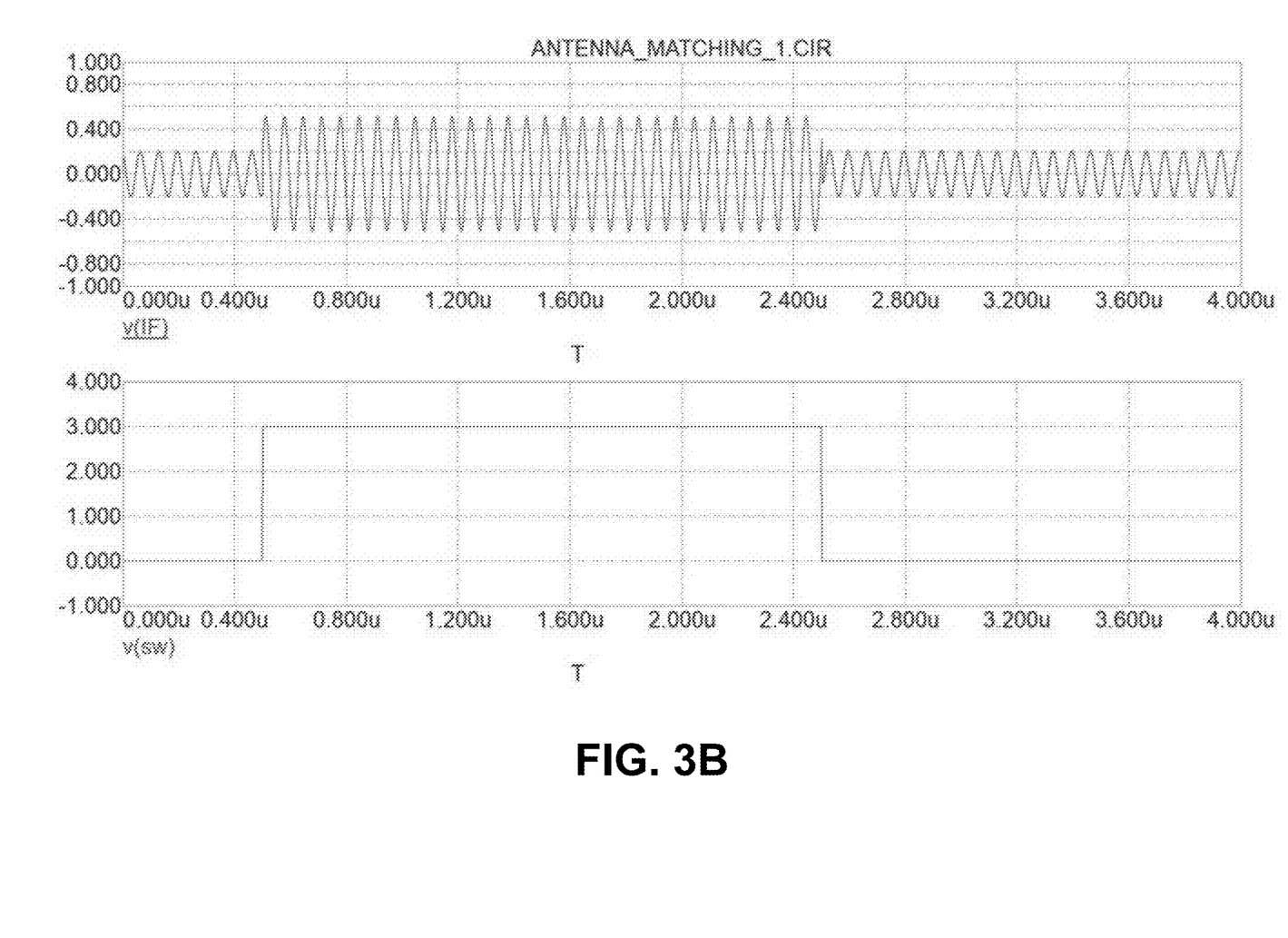

FIGS. 3A and 3B are diagrams of illustrative examples of output signal levels during phases of operation of device 100, as described herein.

FIG. 3A is a diagram illustrating mismatching of the input of antenna 102 during the monitoring phase, as described herein. As illustrated in the lower diagram of FIG. 3A, a control signal may, at a start of the monitoring phase, change from a first level (e.g., 0 volts (V)) to a second level (e.g., 3 V). This control signal may cause switchable impedance matching circuit 108 to be in a first switching state in which switchable impedance matching circuit 108 provides an impedance mismatching between the input of antenna 102 and the RX chain, as described above. As shown in the upper diagram of FIG. 3A, in this example, the RF signal from antenna 102 drops (e.g., from approximately 20 dB to approximately 0 dB). This illustrates that antenna 102 is well mismatched during the monitoring phase. As further shown in the lower diagram of FIG. 3A, the control signal may, at an end of the monitoring phase, change from the second level to the first level. As further illustrated in the upper diagram of FIG. 3A, this may cause switchable impedance matching circuit 108 to be in the second switching state in which switchable impedance matching circuit 108 provides an impedance matching between the input of antenna 102 and the RX chain, as described above.

FIG. 3B is a diagram illustrating partial impedance matching and increased impedance matching of test signal generator 106 as described herein. As illustrated in the lower diagram of FIG. 3B, when the control signal changes from the first level to the second level at the start of the monitoring phase, such that switchable impedance matching circuit 108 is in the first switching state, switchable impedance matching circuit 108 provides an increased impedance mismatching between test signal generator 106 and the RX chain, as described above. As illustrated by the relative output signals in the upper diagram of FIG. 3B, this increase is relative to the impedance matching between test signal generator 106 and the RX chain prior to switchable impedance matching circuit 108 being in the first switching state. As further shown in the upper diagram of FIG. 3B, in this example, the test signal from test signal generator 106 increases. This illustrates that test signal generator 106 has an increased impedance matching during the monitoring phase. As further shown in the lower diagram of FIG. 3B, the control signal may, at an end of the monitoring phase, change from the second level to the first level. As further illustrated in the upper diagram of FIG. 3B, this may cause switchable impedance matching circuit 108 to be in the second switching state, in which switchable impedance matching circuit 108 provides the comparatively decreased impedance matching between test signal generator 106 and the RX chain, as described above. Here, test signal generator 106 may remain powered on to allow operation of switchable impedance matching circuit 108 to be verified during the verification phase. In some implementations, the output signal level of test signal generator 106 may be used in association with verifying operation of switchable impedance matching circuit 108. For example, the control circuit may determine that the output signal level changes from a comparatively higher level during the monitoring phase to a comparatively lower level (e.g., a previously observed level), thereby ensuring a successful switch back of switchable impedance matching circuit 108.

As indicated above, FIGS. 3A and 3B are provided merely as examples. Other examples may differ from what is described with regard to FIGS. 3A and 3B.

Figure 4:
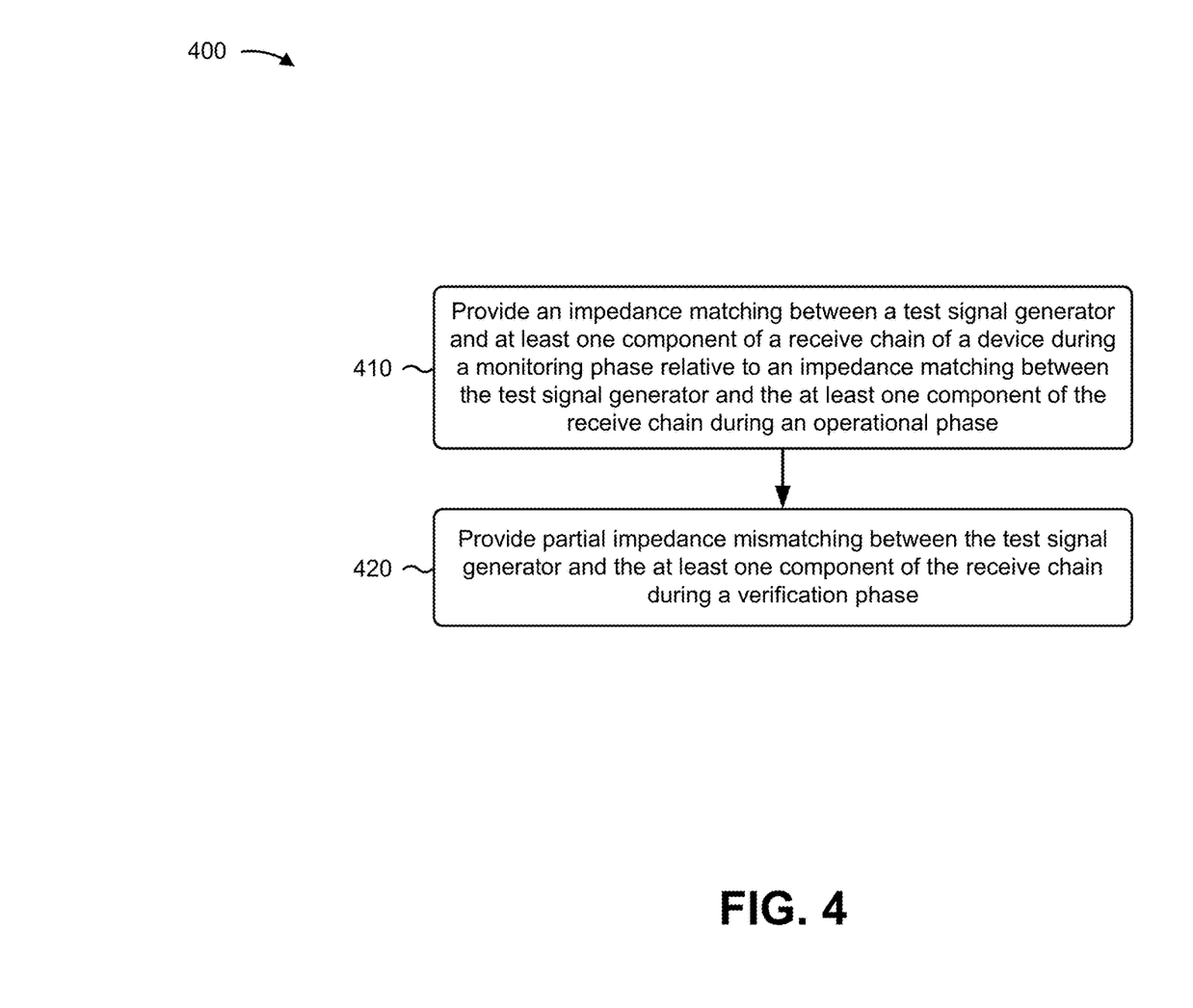
FIGS. 4 and 5 are flowcharts of example processes associated with safety compliant RX monitoring.

FIG. 4 is a flow chart of an example process 400 associated with safety compliant RX monitoring. In some implementations, one or more process blocks of FIG. 4 may be performed by one or more components of FIGS. 1A-C (e.g., switchable impedance matching circuit device 108).

As shown in FIG. 4, process 400 may include providing an impedance matching between a test signal generator and at least one component of a receive chain of a device during a monitoring phase, relative to an impedance matching between the test signal generator and the at least one component of the receive chain during an operational phase (block 410). For example, a switchable impedance matching circuit (e.g., switchable impedance matching circuit 108) may provide an impedance matching between a test signal generator (e.g., test signal generator 106) and at least one component of a receive chain of a device (e.g., device 100) during a monitoring phase relative to an impedance matching between the test signal generator and the at least one component of the receive chain during an operational phase, as described above. In some aspects, the monitoring phase is associated with monitoring one or more components of the receive chain of the device. In some aspects, the impedance matching during the monitoring phase enables one or more measurements based on a test signal generated by the test signal generator.

As further shown in FIG. 4, process 400 may include providing partial impedance mismatching between the test signal generator and the at least one component of the receive chain during a verification phase (block 420). For example, the switchable impedance matching circuit may provide partial impedance mismatching between the test signal generator and the at least one component of the receive chain during a verification phase, as described above. In some aspects, the verification phase is associated with verifying a return of the switchable impedance matching circuit to an impedance matching caused during the operational phase.

Process 400 may include additional implementations, such as any single implementation or any combination of implementations described below and/or in connection with one or more other processes described elsewhere herein.

In some implementations, a control circuit (e.g., included in or communicatively coupled to IF component 114) may verify the return of a switchable impedance matching circuit (e.g., 108) based on detecting, during the verification phase, at least one characteristic of the test signal.

In some implementations, the switchable impedance matching circuit may provide an impedance mismatching between a receive antenna input of the device and an input of the receive chain during the monitoring phase. Here, the impedance mismatching between the receive antenna input and the input of the receive chain may substantially isolate the input of the receive chain from the receive antenna input.

In some implementations, the switchable impedance matching circuit may provide an impedance matching between a receive antenna input of the device and an input of the receive chain during the operational phase.

In some implementations, the test signal generator may be powered off after the verification phase is finished.

In some implementations, a signal may be provided to the switchable impedance matching circuit in association with controlling the switchable impedance matching circuit.

In some implementations, the device forms at least part of a radar MMIC.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

Figure 5:
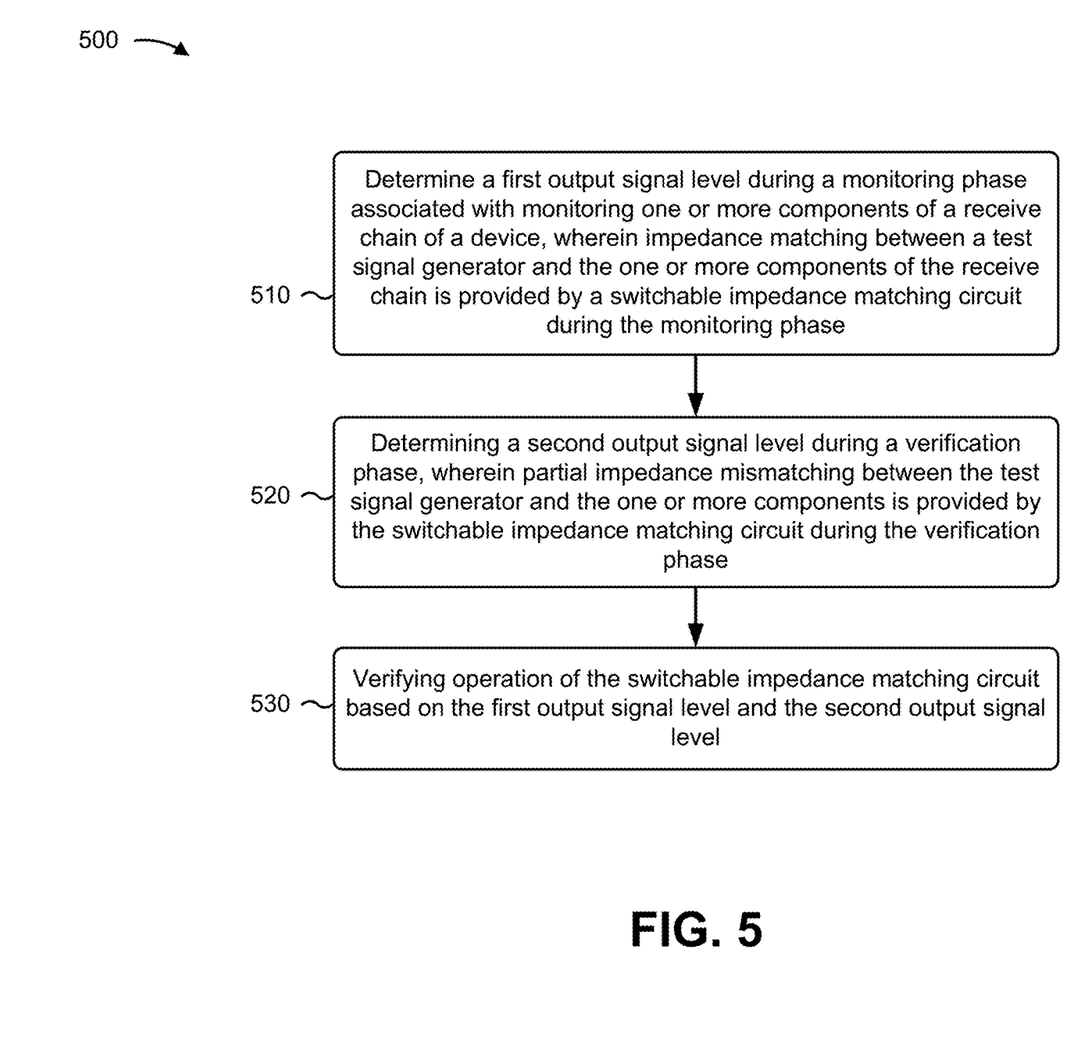

FIG. 5 is a flow chart of an example process 500 associated with safety compliant RX monitoring. In some implementations, one or more process blocks of FIG. 5 may be performed by one or more components of FIG. 1 (e.g., a control circuit included in or communicatively coupled to IF component 114).

As shown in FIG. 5, process 500 may include determining a first output signal level during a monitoring phase associated with monitoring one or more components of a receive chain of a device (block 510). For example, the control circuit may determine a first output signal level during a monitoring phase associated with monitoring one or more components of a receive chain of a device (e.g., device 100), as described above. In some aspects, impedance matching between a test signal generator (e.g., test signal generator 106) and the one or more components of the receive chain is provided by a switchable impedance matching circuit (e.g., switchable impedance matching circuit 108) during the monitoring phase.

As further shown in FIG. 5, process 500 may include determining a second output signal level during a verification phase (block 520). For example, the control circuit may determine a second output signal level during a verification phase, as described above. In some aspects, partial impedance mismatching between the test signal generator and the one or more components is provided by the switchable impedance matching circuit during the verification phase.

As further shown in FIG. 5, process 500 may include verifying operation of the switchable impedance matching circuit based on the first output signal level and the second output signal level (block 530). For example, the control circuit may verify operation of the switchable impedance matching circuit based on the first output signal level and the second output signal level, as described above.

Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

The foregoing disclosure provides illustration and description, but is not intended to be exhaustive or to limit the implementations to the precise forms disclosed. Modifications and variations may be made in light of the above disclosure or may be acquired from practice of the implementations.

As used herein, the term "component" is intended to be broadly construed as hardware, firmware, and/or a combination of hardware and software.

Some implementations are described herein in connection with thresholds. As used herein, satisfying a threshold may, depending on the context, refer to a value being greater than the threshold, more than the threshold, higher than the threshold, greater than or equal to the threshold, less than the threshold, fewer than the threshold, lower than the threshold, less than or equal to the threshold, equal to the threshold, or the like.

It will be apparent that systems and/or methods described herein may be implemented in different forms of hardware, firmware, or a combination of hardware and software. The actual specialized control hardware or software code used to implement these systems and/or methods is not limiting of the implementations. Thus, the operation and behavior of the systems and/or methods are described herein without reference to specific software code—it being understood that software and hardware can be designed to implement the systems and/or methods based on the description herein.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A device, comprising:
   a receive antenna input to couple a receive chain of the device to a receive antenna;
   a test signal generator; and
   a switchable impedance matching circuit coupled to the test signal generator and to the receive chain to:
   cause an impedance matching between the test signal generator and at least one component of the receive chain to be increased during a monitoring phase,
   wherein the impedance matching between the test signal generator and the at least one component of the receive chain is to be increased relative to an impedance matching between the test signal generator and the at least one component of the receive chain during an operational phase,
   wherein the monitoring phase is associated with monitoring the at least one component of the receive chain of the device, and
   wherein the impedance matching during the monitoring phase enables one or more measurements based on a test signal generated by the test signal generator; and
   cause a partial impedance mismatching between the test signal generator and the at least one component of the receive chain during a verification phase,
   wherein the verification phase is associated with verifying a return of the switchable impedance matching circuit to an impedance matching caused during the operational phase; and
   a control circuit to verify operation of the returning of the switchable impedance matching circuit in the verification phase.

2. The device of claim 1, wherein the control circuit is to verify the operation of the returning of the switchable impedance matching circuit based on detecting, during the verification phase, at least one characteristic of the test signal from the test signal generator.

3. The device of claim 1, wherein the switchable impedance matching circuit is further to:
   cause an impedance mismatching between the receive antenna input and an input of the receive chain during the monitoring phase,
   wherein the impedance mismatching of the receive antenna substantially isolates the input of the receive chain from the receive antenna input.

4. The device of claim 1, wherein the switchable impedance matching circuit is further to:
   cause an impedance matching between the receive antenna input and the input of the receive chain during the operational phase.

5. The device of claim 1, wherein the test signal generator is powered off after the verification phase is finished.

6. The device of claim 1, wherein the switchable impedance matching circuit comprises a switch coupled to a control signal generator to:
   provide a signal in association with controlling the switchable impedance matching circuit.

7. The device of claim 1, wherein the device forms at least a part of a radar monolithic microwave integrated circuit.

8. A method, comprising:
   providing, by a switchable impedance matching circuit, an impedance matching between a test signal generator and at least one component of a receive chain of a device during a monitoring phase relative to an impedance matching between the test signal generator and the at least one component of the receive chain during an operational phase,
  wherein the monitoring phase is associated with monitoring one or more components of the receive chain of the device, and
  wherein the impedance matching during the monitoring phase enables one or more measurements based on a test signal generated by the test signal generator; and
providing, by the switchable impedance matching circuit, partial impedance mismatching between the test signal generator and the at least one component of the receive chain during a verification phase,
  wherein the verification phase is associated with verifying a return of the switchable impedance matching circuit to an impedance matching caused during the operational phase.

9. The method of claim 8, further comprising:
verifying, by a control circuit, the return of the switchable impedance matching circuit based on detecting, during the verification phase, at least one characteristic of the test signal.

10. The method of claim 8, further comprising:
providing an impedance mismatching between a receive antenna input of the device and an input of the receive chain during the monitoring phase,
  wherein the impedance mismatching between the receive antenna input and the input of the receive chain substantially isolates the input of the receive chain from the receive antenna input.

11. The method of claim 8, further comprising:
providing an impedance matching between a receive antenna input of the device and an input of the receive chain during the operational phase.

12. The method of claim 8, further comprising:
powering off the test signal generator after the verification phase is finished.

13. The method of claim 8, further comprising:
providing a signal to the switchable impedance matching circuit in association with controlling the switchable impedance matching circuit.

14. The method of claim 8, wherein the device forms at least part of a radar monolithic microwave integrated circuit.

* * * * *